United States Patent
Ostermann et al.

(10) Patent No.: US 7,244,086 B2
(45) Date of Patent: Jul. 17, 2007

(54) APPARATUS FOR VACUUM TREATING TWO DIMENSIONALLY EXTENDED SUBSTRATES AND METHOD FOR MANUFACTURING SUCH SUBSTRATES

(75) Inventors: Rainer Ostermann, Klaus (AT); Arthur Buechel, Ruggell (LI); Mustapha Elyaakoubi, Ris-Orangis (FR)

(73) Assignee: OC Oerlikon Balzers AG, Balzers (LI)

( * ) Notice: Subject to any disclaimer, the term of this patent is extended or adjusted under 35 U.S.C. 154(b) by 304 days.

(21) Appl. No.: 10/713,339

(22) Filed: Nov. 14, 2003

(65) Prior Publication Data
US 2004/0115032 A1    Jun. 17, 2004

(51) Int. Cl.
*H01L 21/677* (2006.01)
(52) U.S. Cl. ........................ 414/217; 414/939
(58) Field of Classification Search ............ 414/217, 414/939; 118/719; 204/298.25, 298.35
See application file for complete search history.

(56) References Cited

U.S. PATENT DOCUMENTS

| | | | | |
|---|---|---|---|---|
| 2,933,207 | A * | 4/1960 | Edmonds et al. ............ 414/791 |
| 5,275,709 | A * | 1/1994 | Anderle et al. ........ 204/298.25 |
| 5,512,320 | A | 4/1996 | Turner et al. |
| 5,515,986 | A | 5/1996 | Turlot et al. |
| 5,788,447 | A * | 8/1998 | Yonemitsu et al. ......... 414/217 |
| 5,798,739 | A | 8/1998 | Teitel |
| 5,961,323 | A | 10/1999 | Chunghsin |
| 6,066,210 | A * | 5/2000 | Yonemitsu et al. ......... 118/719 |
| 6,099,643 | A * | 8/2000 | Ohtani et al. ................. 118/52 |
| 6,177,129 | B1 | 1/2001 | Wagner et al. |
| 6,238,161 | B1 | 5/2001 | Kirkpatrick et al. |
| 6,290,405 | B1 * | 9/2001 | Ueda .......................... 396/611 |
| 6,296,735 | B1 * | 10/2001 | Marxer et al. ......... 156/345.32 |
| 6,313,903 | B1 * | 11/2001 | Ogata ........................... 355/27 |
| 6,318,945 | B1 * | 11/2001 | Hofmeister .................. 414/217 |
| 6,382,895 | B1 * | 5/2002 | Konishi et al. .............. 414/217 |
| 6,391,377 | B1 | 5/2002 | Wagner et al. |
| 6,471,422 | B1 * | 10/2002 | Ueda et al. .................. 396/611 |
| 6,503,365 | B1 * | 1/2003 | Kim et al. .............. 156/345.32 |
| 6,533,534 | B2 | 3/2003 | Schmitt et al. |
| 6,593,045 | B2 * | 7/2003 | Sato et al. ..................... 430/30 |
| 6,790,287 | B2 * | 9/2004 | Shiga et al. ................. 118/719 |
| 6,896,466 | B2 * | 5/2005 | Nishimura et al. .... 414/226.05 |
| 2001/0041120 | A1 * | 11/2001 | Hofmeister .................. 414/217 |

(Continued)

FOREIGN PATENT DOCUMENTS

WO    WO 9104213 A1 *  4/1991

OTHER PUBLICATIONS

Bocko & Mitchell, AMLCD Glass Substrates-Foundation for High-Tech Displays, The GlassResearcher, vol. 12 No. 1 & 2, p. 26-29, 2002-2003.*

*Primary Examiner*—Patrick Mackey
*Assistant Examiner*—Charles Greenhut
(74) *Attorney, Agent, or Firm*—Pearne & Gordon LLP

(57) ABSTRACT

A vacuum transport chamber has a transport robot arrangement. A processing arrangement has at least one processing station communicating by at least one workpiece pass-through opening with the vacuum transport chamber. A loadlock arrangement communicates by at least one workpiece pass-through opening with an atmosphere outside the vacuum transport chamber and the processing arrangement. One single loadlock and processing tower is formed by the processing arrangement and the loadlock arrangement being arranged vertically on upon the other.

9 Claims, 8 Drawing Sheets

U.S. PATENT DOCUMENTS

Figure 1:
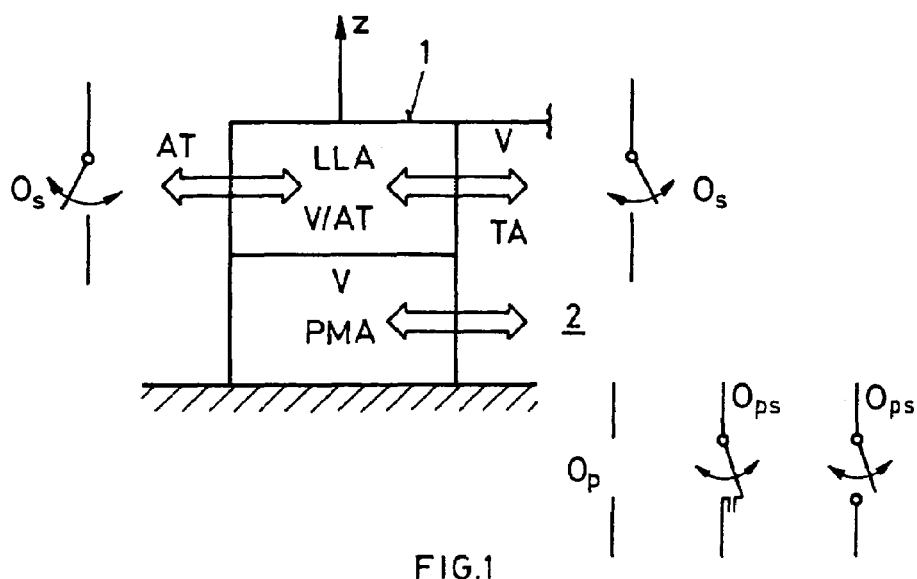

| | | | |
|---|---|---|---|
| 2002/0009658 A1* | 1/2002 | Sato et al. | 430/30 |
| 2002/0033136 A1 | 3/2002 | Mayer | |
| 2002/0168251 A1* | 11/2002 | Choi et al. | 414/217 |
| 2003/0053893 A1 | 3/2003 | Matsunaga et al. | |
| 2005/0051092 A1* | 3/2005 | Makino et al. | 118/719 |
| 2005/0051093 A1* | 3/2005 | Makino et al. | 118/719 |
| 2005/0193948 A1* | 9/2005 | Oohirabaru et al. | 118/719 |

* cited by examiner

APPARATUS FOR VACUUM TREATING TWO DIMENSIONALLY EXTENDED SUBSTRATES AND METHOD FOR MANUFACTURING SUCH SUBSTRATES

The present invention is most generically directed on vacuum treating of extended relatively thin substrates as especially substrates for manufacturing solar panels, TFT display panels, or plasma display panels. Here large and thin substrates, as e.g. of glass have to be vacuum process treated thereby including deposition of semi-conductive layers.

Industrial manufacturing of such extended substrates necessitates careful handling. Thereby it has become customary to maintain such substrates horizontally oriented during transporting and during vacuum processing in spite of the fact that particle contamination of the substrate may be more critical in a horizontal position than in mere vertical position. Horizontal transporting and processing has nevertheless considerable advantages with respect to stable, vibration free support of the substrates. With respect to techniques for handling and vacuum processing such substrates attention is drawn to the following documents U.S. Pat. No. 6,533,534;
U.S. Pat. No. 6,391,377;
U.S. Pat. No. 6,177,129;
U.S. Pat. No. 5,515,986;
U.S. Pat. No. 6,296,735, all of the same applicant as the present application.

Further attention is drawn to the
U.S. Pat. No. 5,512,320;
U.S. Pat. No. 5,798,739;
U.S. Pat. No. 6,238,161.

As the substrates to be vacuum treated and of the type mentioned above becomes lager and larger, on the one hand the apparatuses for industrially and automatically treating such substrates become larger and larger. Because the substrates are maintained during transporting and vacuum processing in horizontal orientation the apparatus for such substrate processing especially becomes large with respect to their footprint surface. Because such treating facilities or apparatus are installed in clean room ambient, this leads to an increased volume thereof which significantly raises manufacturing costs.

Further, handling robots become larger especially under consideration of their footprint surfaces and must be tailored to safely transport such substrates between loadlocks and processing stations in the vacuum treatment facilities.

Form the U.S. Pat. No. 5,275,709 there is known an apparatus for coating large substrates which is apparently especially compact, which is conceived with a minimum of chambers and apparently permits multilayer coating of high quality of such substrates. This known apparatus shall further apparently be comparatively inexpensive to manufacture by having a minimum of chamber wall surfaces.

The known apparatus is principally conceived with loadlock- and processing chambers vertically stacked one upon the other with a transport chamber performing substrate handling between a loadlock chamber and the processing chambers. By the fact that loadlock and processing chambers are stacked one upon the other in a tower-like concept, the overall footprint of the apparatus is minimized although handling and processing the substrates in horizontal orientation.

More specifically the known apparatus provides for two vertical towers, one thereof consisting of an input/output loadlock chamber and processing chambers arranged beneath the loadlock chamber, the other tower consisting only of processing chambers. The two towers are arranged with workpiece handling openings facing each other on opposite sides of a central transport arrangement which has a lift type transport robot serving the openings of the two towers.

Although the apparatus as known from this U.S. Pat. No. 5,275,709 proposes a concept which, considered from the principal of construing a multiple chamber plant by vertical stapling, minimizes its footprint surface, it has the drawback that it provides for a multiple processing facility whereat both towers are exploited to perform one single substrate multi-step process. The substrates are all input from ambient to the processing facility by one input/output loadlock chamber, are then transported as desired forth and back between processing stations at both of the towers and are finally removed from the processing facility by the said one loadlock chamber.

It is an object of the present invention on the one hand to maintain the principal tower structure concept as of the U.S. Pat. Ser. No. 5,275,709 for large substrate processing thereby further improving simplicity of substrate handling and improving flexibility with respect to treating such substrates by well defined multiple steps substrate processing.

This object is realized by an apparatus for vacuum treating two-dimensionally extended substrates comprising
 (a) a vacuum transport chamber with a transport robot arrangement;
 (b) a processing arrangement with at least one processing station communicating by at least one workpiece pass-through opening with the vacuum transport chamber;
 (c) a loadlock arrangement communicating by at least one workpiece pass-through opening with the vacuum transport chamber and by at least one further workpiece pass-through opening with an atmosphere outside said vacuum transport chamber as well as said processing arrangement;
 ($d_1$) one single loadlock- and processing tower formed by said processing arrangement and said loadlock arrangement, arranged vertically one upon the other.

Thereby the overall processing of the substrate is done by exclusive vertical transportation of the substrates from loadlock towards the at least one processing chamber as provided, most preferably to more than one of such processing chambers, and by horizontal transport to serve the substrates into and from these chambers. The loadlock- and processing tower thereby defines for a self-contained, all-in-one substrate processing module.

In a second preferred mode such apparatus comprises
 (a) a vacuum transport chamber with a transport robot arrangement;
 (b) a processing arrangement with at least one processing station communicating by at least one workpiece pass-through opening with the vacuum transport chamber;
 (c) a loadlock arrangement which communicates by at least one workpiece pass-through opening with the vacuum transport chamber and by at least one further workpiece pass-through opening with an atmosphere which is outside the vacuum transport chamber and the processing arrangement thus with a surrounding atmosphere of the apparatus;
 ($d_2$) at least two loadlock- and processing towers, each formed by one loadlock arrangement and one processing arrangement.

This second preferred mode has thus at least two loadlock- and processing towers each formed by one loadlock arrangement and one processing arrangement. Thereby one single transport arrangement is used to serve the two or more than two loadlock- and processing towers. Each of these towers thereby defines in a self-contained all-in-one desired multi-step substrate process inclusive input and output loadlocking the substrates. Thereby complete parallel, multi-step processing ability is realised of equal or different multi-step processes.

In spite of the fact that more than two of the loadlock- and processing towers may be grouped around the transport chamber, an optimum structure with respect to simplicity and space, especially footprint surface, in a two loadlock- and processing tower concept with one transport chamber can be accomplished. Along the towers either identical substrate multiple step processing is performed or there is performed in each of the laodlock- and processing towers a distinct desired and different process.

In spite of the fact that the principal according to the present invention is to perform in each of the loadlock- and processing towers provided a self-contained multiple step substrate process it shall not be excluded that there might be provided a processing chamber or compartment which is used for processing substrates from both or from a number of loadlock- and processing towers as provided. Such a commonly used compartment or chamber may for instance be a intermediate storage chamber for substrates to be longterm equalized with respect to their temperature after having been treated and before being despatched by the respective loadlock to ambient. Such a commonly used treatment compartment or chamber may be provided for instance beneath both towers as provided, thereby exploiting for substrate intermediate storage the overall footprint surface of the apparatus.

As will be explained more in details later, the apparatus according to the present invention may be conceived to provide for single substrate or for substrate batch processing or, in a mixed mode, for single substrate and substrate batch processing along the at least one loadlock and processing tower as provided.

In a further preferred improvement of both preferred embodiments as outlined above the transport robot comprises at least one substantially horizontal substrate support for at least one substrate whereby the substrate support is driven and controllably movable in a vertical direction to bring the substrate in alignment with an opening to one of the addressed towers and which is further driven and controllably movable in horizontal direction to bring the substrate support into and out of one of the towers thereby leaving such substrate in the tower for processing or loadlocking or removing such substrate from processing or from loadlocking.

In a still further preferred improvement the substrate support is additionally rotatable about a vertical axis in a controllably driven manner. Nevertheless, if the substrate support is rotatable at all the rotational movement is preferably limited to at most 180° thereby even more preferred, to at most 45°. Nevertheless, in the today's most preferred embodiment the substrate support is exclusively moveable in a controllably driven manner linearly horizontally and vertically.

In a further preferred improvement of both the embodiments as outlined above at least one of the processing arrangements comprises at least one substrate batch processing module wherein simultaneously more than one substrate are loaded, processed simultaneously and simultaneously removed. A further embodiment, which may also be combined with substrate batch handling and processing the at least one processing arrangement, comprises at least one single substrate processing module.

Turning to specific conception of the loadlock arrangement in preferred modes, in one preferred improvement of both preferred embodiments the at least one loadlock arrangement comprises an input/output loadlock arrangement whereat both loadlocking of at least one substrate from surrounding atmosphere towards the transport chamber as well as from the transport chamber towards surrounding atmosphere are performed.

In a further preferred mode such input/output loadlock arrangement comprises at least one single substrate input loadlock chamber. In a still further mode the said input/output loadlock arrangement comprises at least one single substrate output loadlock chamber. Still a further mode of the addressed input/output loadlock arrangement comprises at least one of a substrate batch input loadlock chamber, of a substrate batch output loadlock chamber and of an input/output substrate batch loadlock chamber. According to the second preferred embodiment with at least two loadlock- and processing towers, a further mode comprises one of the loadlock- and processing towers comprising one of an input and of output loadlock arrangement.

A further preferred mode of the second preferred embodiment has exclusively two of the loadlock- and processing towers which are arranged opposite one another i.e. on opposite sides of the transport vacuum chamber and thus facing each other with their respective openings via the transport chamber. This is an I-type concept.

In a second preferred mode of that second preferred embodiment, the apparatus has still exclusively two loadlock- and processing towers which are arranged one aside the other and on one side of the vacuum transport chamber thereby concomitantly defining with the vacuum transport chamber a U-type footprint surface.

In a third preferred mode, nevertheless less preferred than the just addressed second mode of the second preferred embodiment, the apparatus has still exclusively two loadlock- and processing towers which concomitantly define for a Y-type footprint surface together with the transport chamber.

In a still further preferred mode of both preferred embodiments as outlined above, the apparatus has a substrate handling and processing ability for substrates which have an extent of at least 1 m$^2$, preferably of at least 2 m$^2$ and especially preferred even of at least 4 m$^2$.

In a further preferred mode of both preferred embodiments, the loadlock arrangement comprises at least one of a heating and of cooling arrangement for at least one substrate.

According to the present invention there is further proposed a method for manufacturing two-dimensionally extended vacuum treated substrates which comprise the steps of:
  introducing at least one horizontal substrate horizontally into a loadlock chamber;
  transporting said at least one horizontal substrate from said laodlock chamber horizontally into a vacuum transport chamber;
  controllably moving said horizontal substrate vertically up or down;
  horizontally introducing said horizontal substrate into a processing chamber;
  treating said horizontal substrate in said processing chamber;
  horizontally removing said treated horizontal substrate from said processing station back into said vacuum transport chamber;

vertically transporting said horizontal substrate upwards or downwards within said transport chamber;
horizontally transporting said treated horizontal substrate from said transport chamber into a loadlock chamber;
removing said treated horizontal substrate horizontally from said loadlock chamber thereby moving said substrate exclusively linearly.

Thereby, in a preferred embodiment of the method according to the present invention the vacuum treated substrates are one of solar panel substrates, of TFT display panel substrates and of plasma display panels.

The present invention will now be described more in detail with the help of figures which show examples of preferred embodiments of the present invention.

The figures show:

FIG. 1 A schematic side view of a loadlock- and processing tower as an essential component of the present invention thereby additionally showing different operating modes of opening control at such tower.

Figures 2, 3:
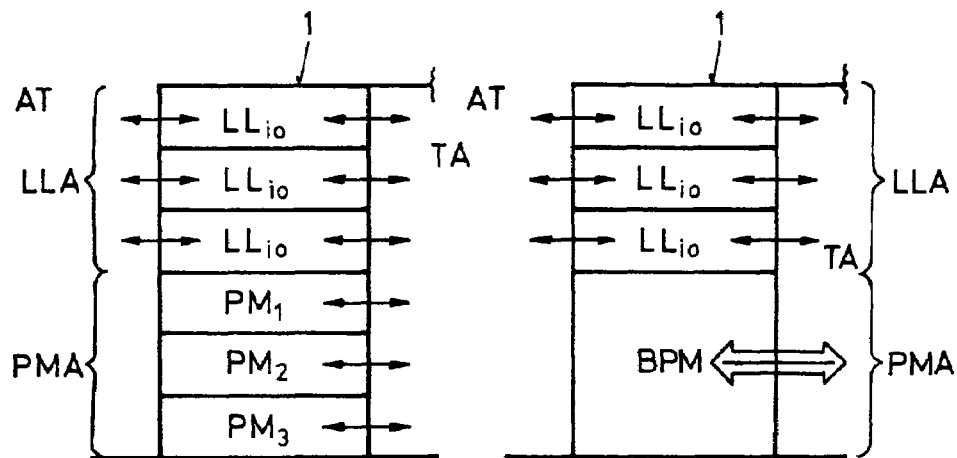

FIG. 2 Still, in a schematic representation according to FIG. 1, a first preferred embodiment of a loadlock- and processing tower.

FIG. 3 In a still schematic representation in analogy to that of the FIG. 1 or 2, a still further preferred mode of a loadlock- and processing tower.

Figures 4, 5:
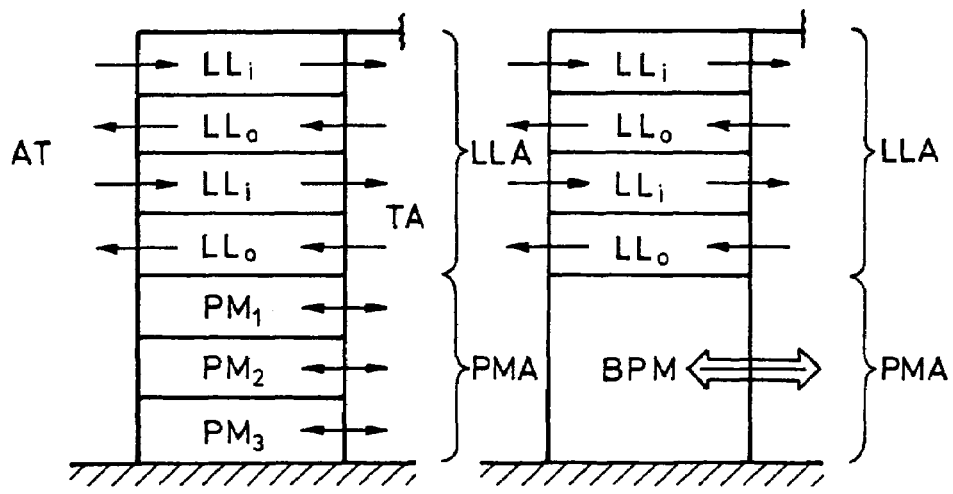

FIG. 4 In analogy to the representations of FIGS. 1 to 3, a third preferred variant of a loadlock and processing tower.

FIG. 5 Still in a representation in analogy to that of the FIGS. 1 to 4, a fourth preferred embodiment of a loadlock- and processing tower.

Figure 6:
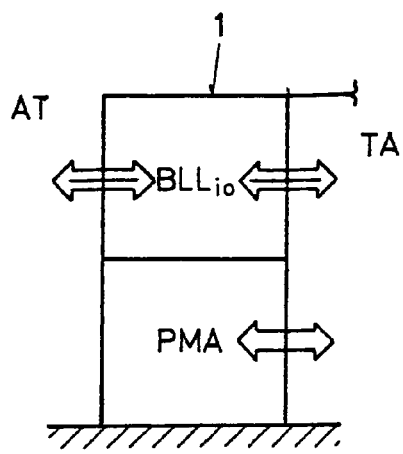

FIG. 6 Still in a representation in analogy to that of the FIGS. 1 to 5, a fifth preferred variant of a loadlock- and processing tower.

Figure 7:
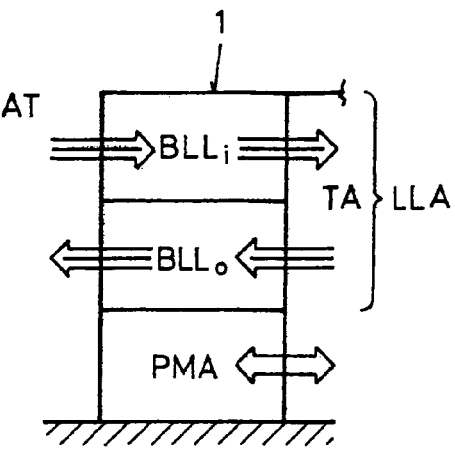

FIG. 7 Still in a representation in analogy to that of the FIGS. 1 to 6, a sixth preferred embodiment of a loadlock- and processing tower.

Figure 8:
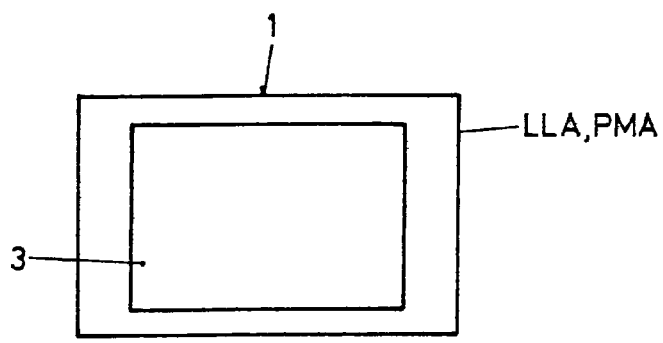

FIG. 8 In a schematic representation a top view upon a loadlock- and processing tower as of one of the embodiments according to FIGS. 1 to 7 with a large surface substrate arranged therein.

Figure 9:
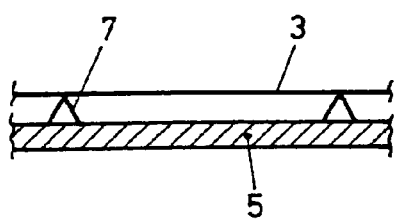

FIG. 9 Schematically a positioning arrangement for sustaining large substrates at specific positions within a loadlock- and processing tower.

Figure 10:
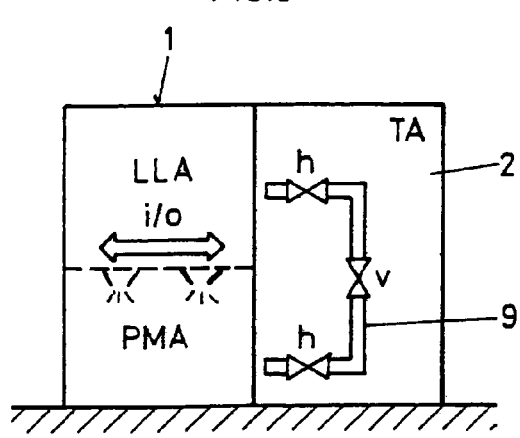

FIG. 10 In a schematic side view, a first preferred embodiment of an apparatus according to the present invention and operating according to the manufacturing method of the present invention, comprising one single loadlock- and processing tower served by a robot in a vacuum transport chamber.

FIG. 11 Again in a schematic representation a top view on the apparatus according to FIG. 10.

Figure 12:
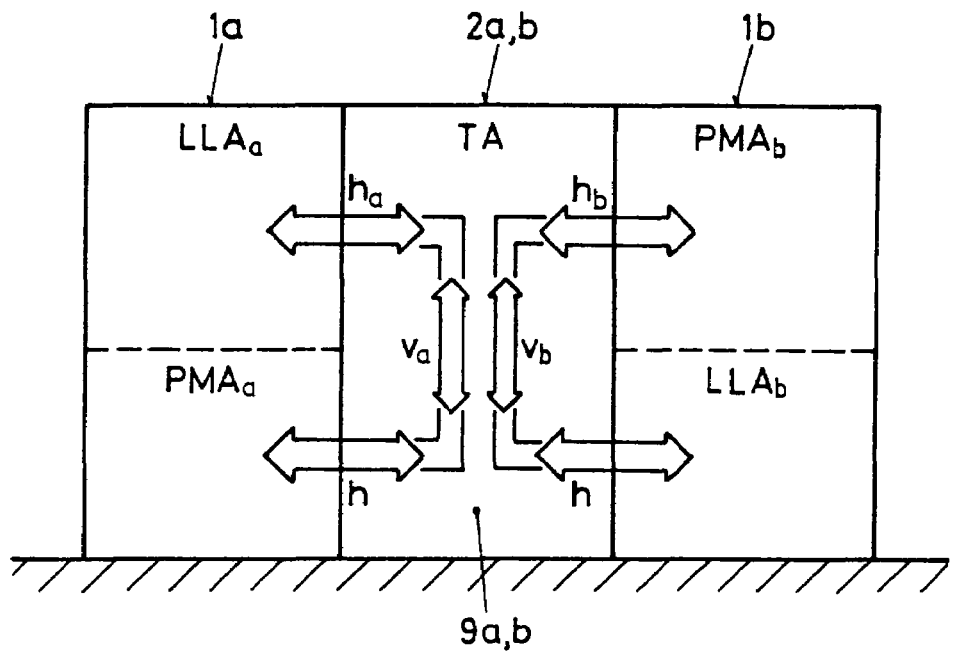

FIG. 12 In a schematic side view in analogy to the representation of FIG. 10, a second preferred embodiment of the apparatus according to the present invention and performing the method according to the present invention with two loadlock- and processing towers and an intermediate vacuum transport chamber.

Figure 11:
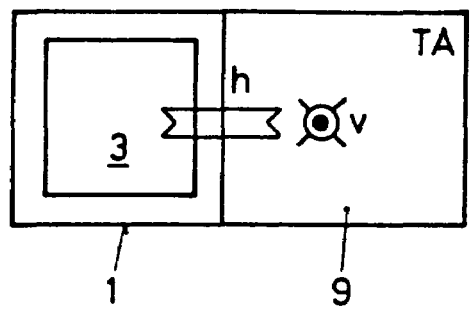
Figure 13:
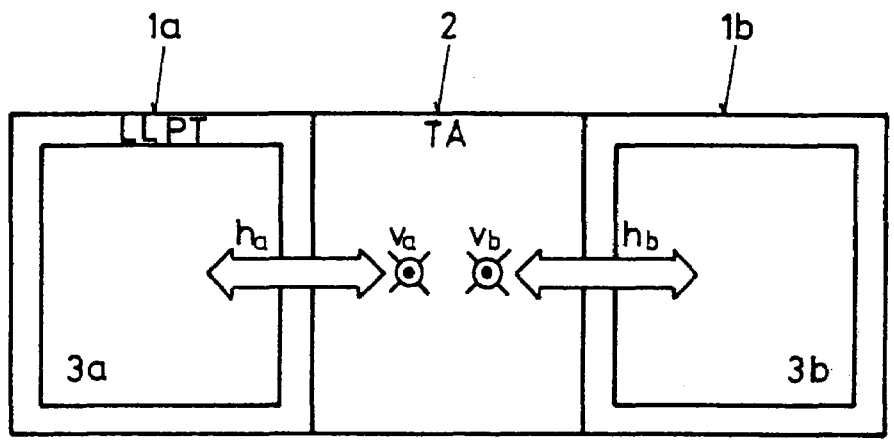

FIG. 13 In a representation in analogy to that of FIG. 11, a schematic top view on the embodiment of the apparatus as of FIG. 12.

Figure 14:
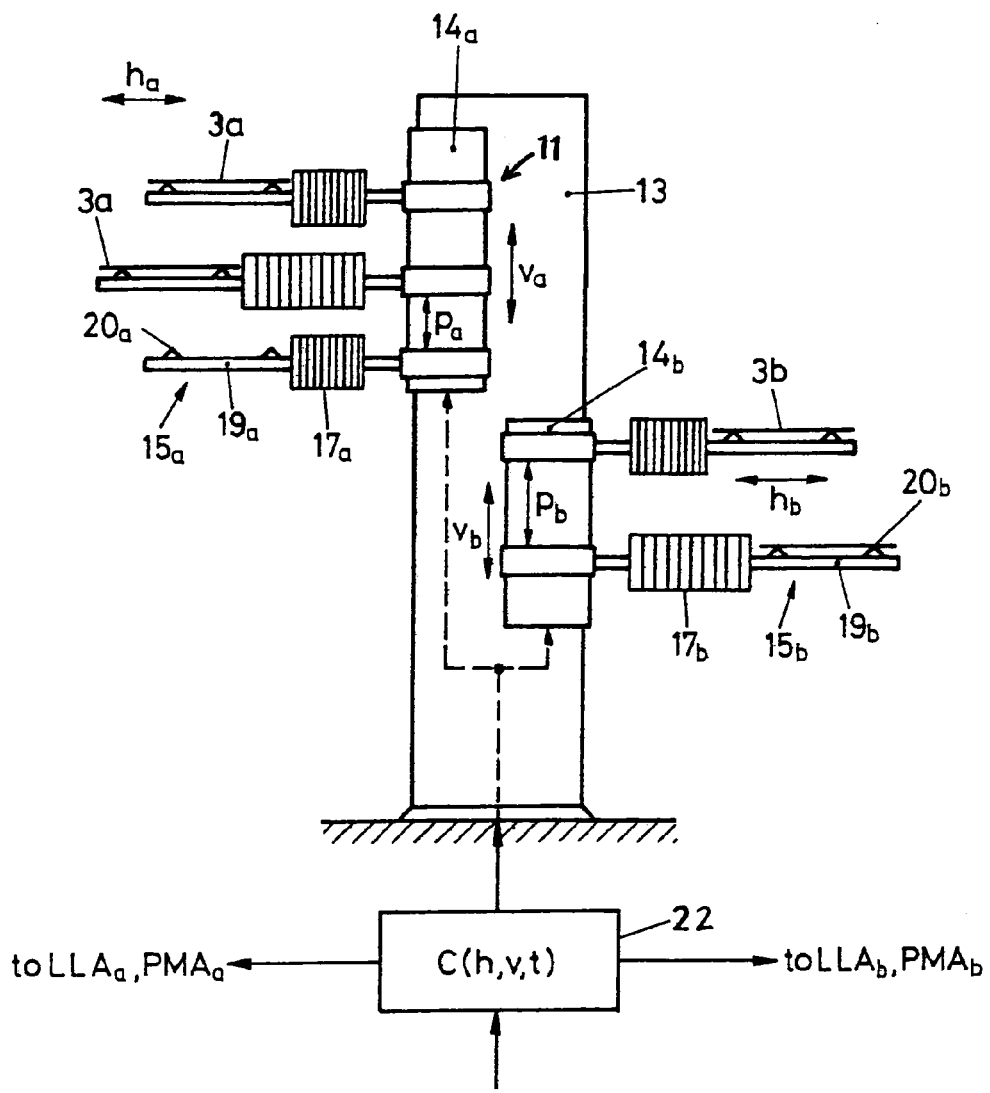

FIG. 14 In a simplified and schematic representation, a robot arrangement as e.g. provided in a transport chamber as used in the embodiment of the apparatus according to FIG. 12.

Figure 15:
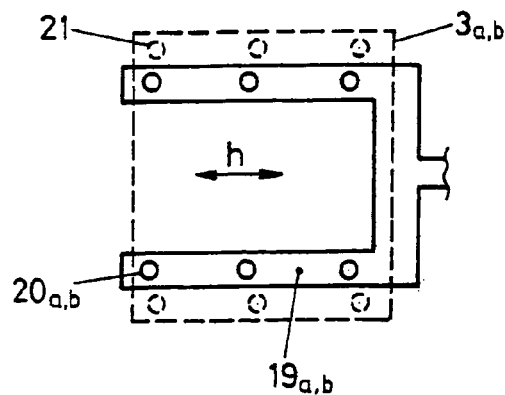

FIG. 15 In a schematic top view, a substrate support as used in a robot e.g. according to FIG. 14 for supporting substrates during handling.

Figure 16:
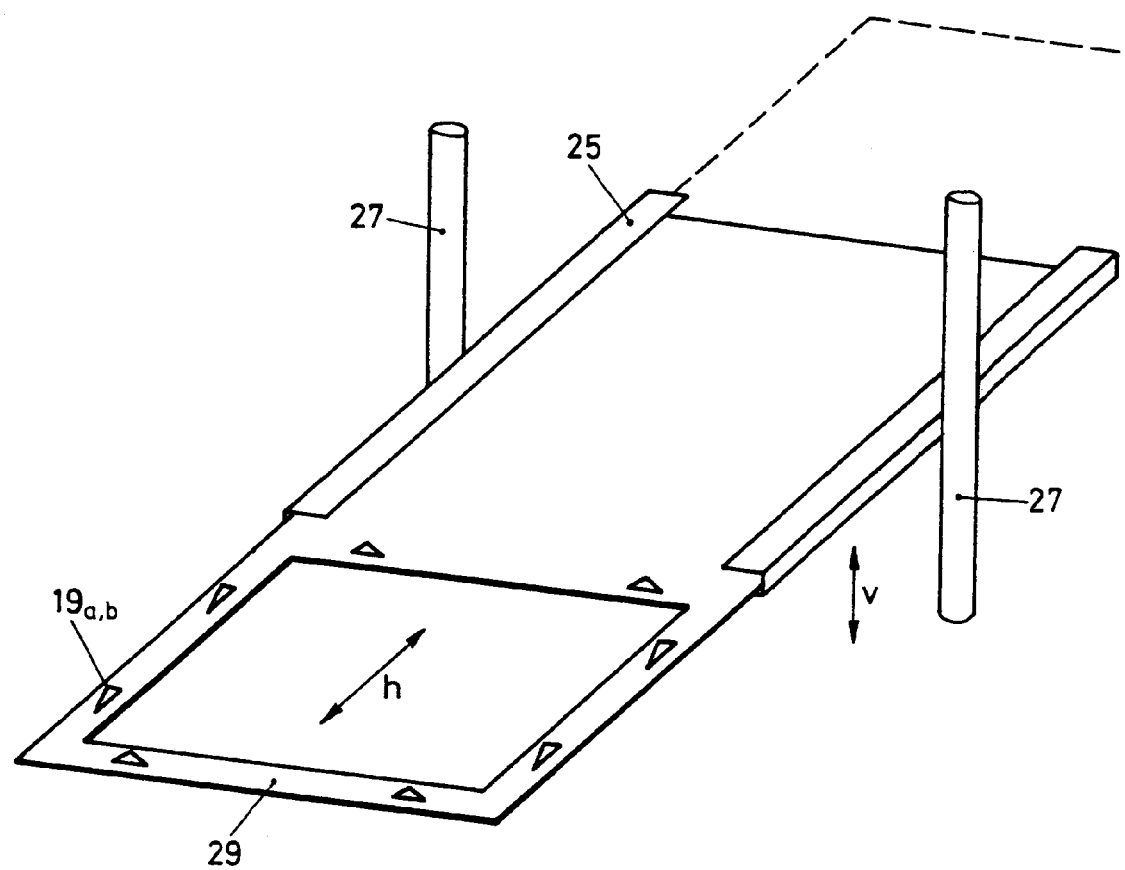

FIG. 16 In a schematic perspective view a third variant of a robot within a vacuum transport chamber as e.g. applied in the embodiment of FIG. 12, for handling substrates to both loadlock- and processing towers.

Figure 17:
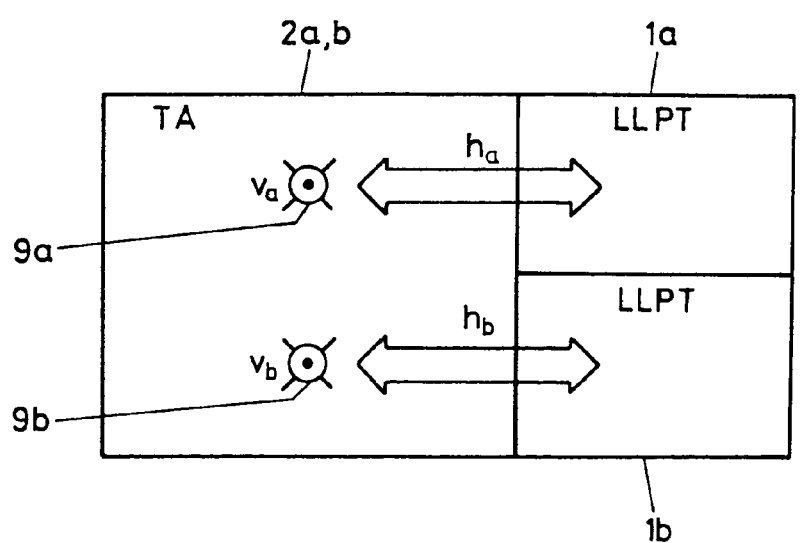

FIG. 17 In a schematic top view a further preferred embodiment of an apparatus according to the present invention with two loalock- and processing towers in U-configuration.

Figure 18:
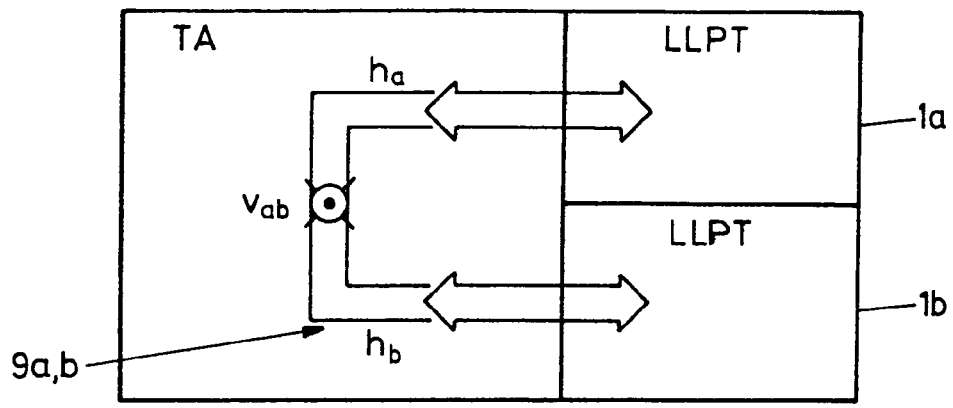
Figure 19:
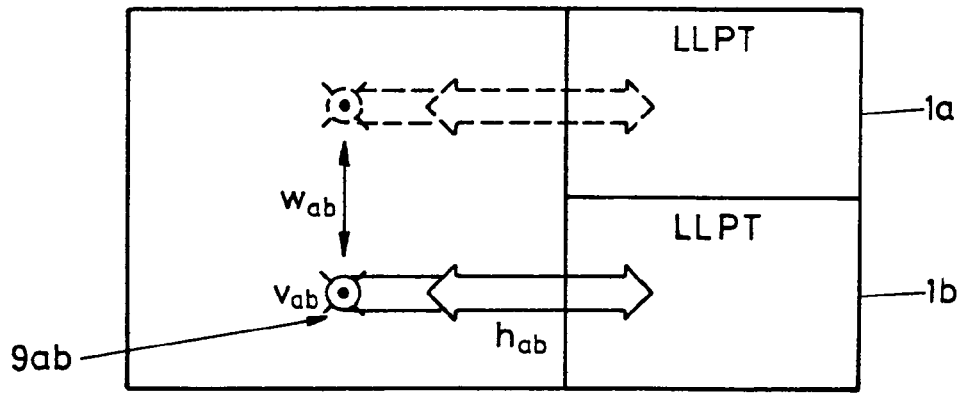

FIG. 18 and FIG. 19 in a representation in analogy to that of FIG. 17, two further preferred embodiments of the two loadlock- and processing tower concept in U-configuration.

Figure 20:
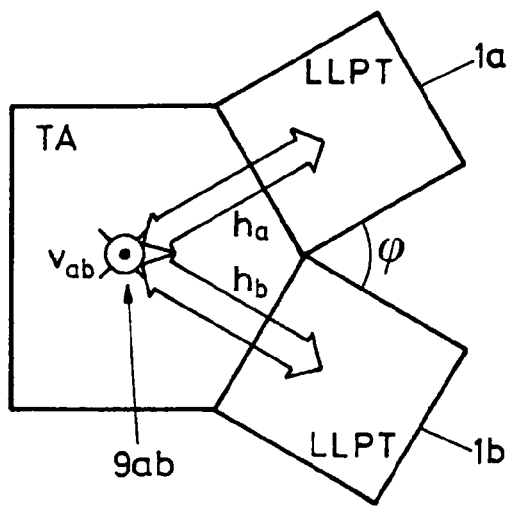

FIG. 20 A further embodiment of the apparatus according to the present invention with two loadlock- and processing towers arranged with respect to a common vacuum transport chamber in Y-configuration in top view.

Figure 21:
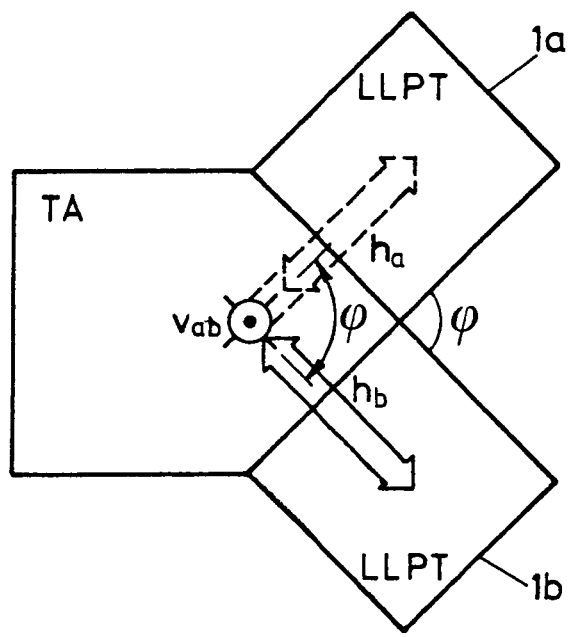

FIG. 21 The embodiment according to FIG. 20 still in a schematic top view representation with a different mode of realising a robot within the vacuum transport chamber.

Figure 22:
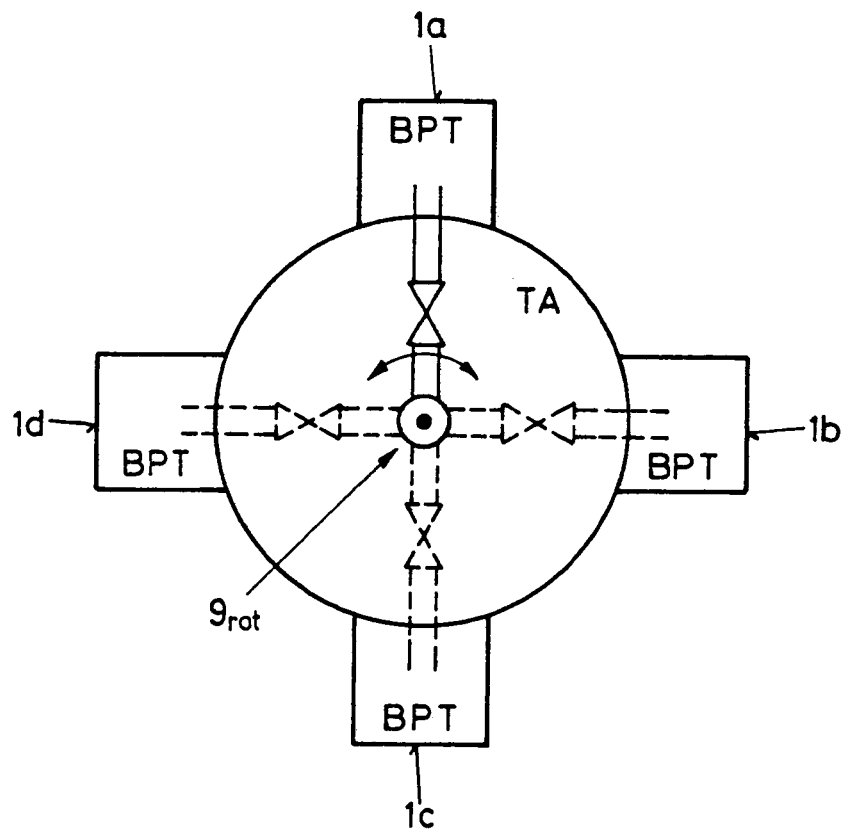

FIG. 22 Still in a schematic top view, a further embodiment of the apparatus according to the present invention with four loadlock- and processing towers served by a common rotatable robot within a vacuum transport chamber.

Figure 23:
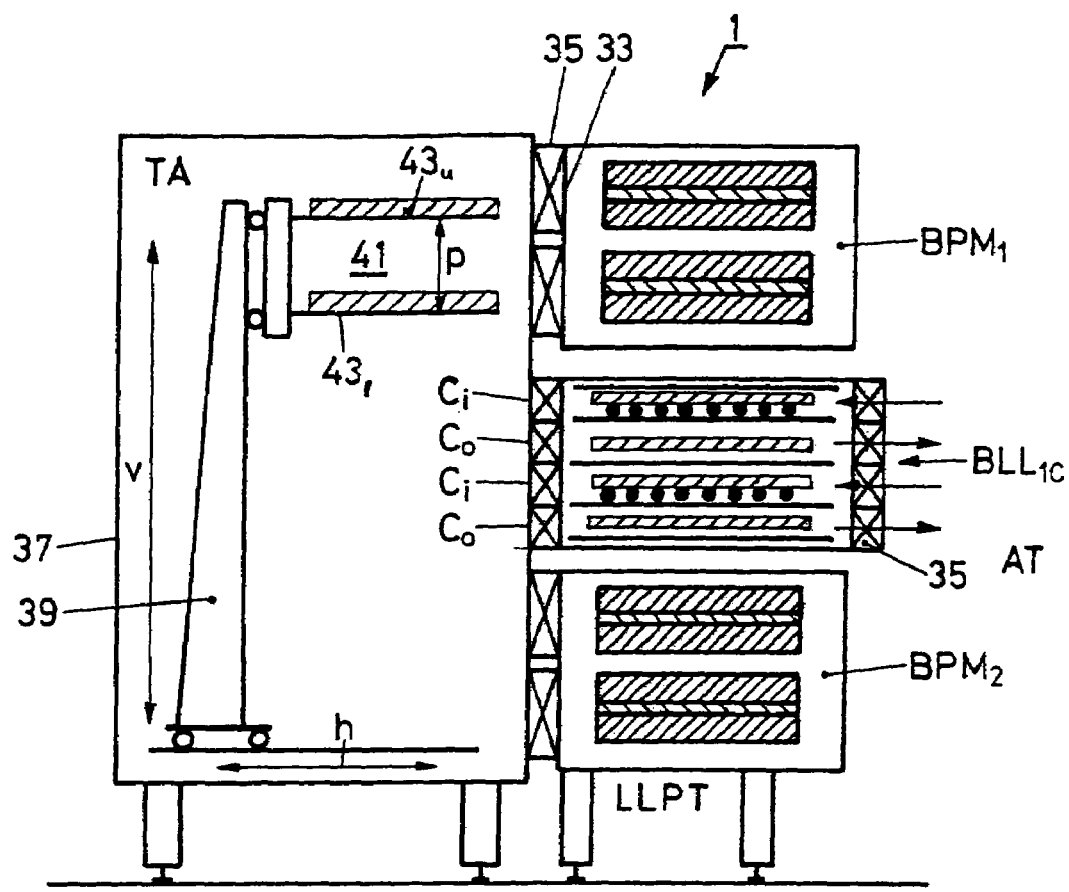

FIG. 23 In a more detailed but still schematic representation a side view of an apparatus according to the present invention and following up the concept as shown in FIG. 10 and 11 as one of today's most preferred embodiments.

In FIG. 1 there is shown schematically the side view of a loadlock- and processing tower LLPT 1 as one essential part of the present invention. The LLPT is a vertical tower which comprises a loadlock arrangement LLA and a processing arrangement PMA. As will be exemplified later, the loadlock arrangement LLA may comprise at least one single substrate input/output loadlock chamber, at least one single substrate input loadlock chamber, at least one single substrate output loadlock chamber, at least one substrate batch input/output load lock chamber, at least one substrate batch input loadlock chamber, at least one substrate batch output loadlock chamber.

Thus, principally the loadlock arrangement LLA of the LLPT 1 comprises at least one loadlock chamber. The loadlock arrangement LLA as of FIG. 1 communicates on the one hand with an outside atmosphere AT as with ambient atmosphere, and on the other hand with a vacuum atmosphere V in a transport arrangement TA 2. The double line/double direction arrows in FIG. 1 indicate most generically two-directional handling of one or more than one substrate between the atmosphere AT, the interior of the loadlock arrangement LLA and the transport arrangement TA 2.

Nevertheless, it must be pointed out that in some configurations of an overall apparatus according to the present invention, a LLPT 1 may have a loadlock arrangement LLA which has only an input load lock arrangement or only an output load lock arrangement, i.e. a loadlock arrangement for transmitting substrates from the atmosphere AT towards the transport arrangement TA 2, or for transmitting substrates from the transport arrangement TA 2 towards the atmosphere AT.

As further schematically shown handling of the one or more than one substrate between the loadlock arrangement LLA and atmosphere AT as well as the transport arrangement TA 2 is performed via respective openings O which are sealably and controllably closable by respective loadlock valves, as schematically shown in FIG. 1 by the controllable, sealably closable openings $O_s$.

The loadlock- and processing tower LLPT 1 further comprises a process module arrangement PMA which comprises one or preferably more than one processing chambers. Such processing chambers may thereby be single substrate processing chambers or substrate batch processing chambers. Therein the respective substrates or substrate batches are processed by a vacuum treatment process, thereby e.g. by a CVD, PECVD, PVD process, or by heating, cooling, etc. With respect to substrate heating and/or cooling, nevertheless such processing may be performed exclusively or additionally within the LLA.

As further schematically shown in FIG. 1, generically the PMA and the transport arrangement TA are in two-directional substrate handling communication. Further and dependent on the type of processes performed in the PMA and their specific requirements with respect to cleanliness, such bi-directional substrate handling between PMA and TA occurs via openings O which are, as also schematically shown in FIG. 1 permanent open, $O_p$, controllably closable but not sealingly closable, $O_{ps}$, or controllably and sealingly closable, $O_s$.

The important feature of the loadlock- and processing tower LLPT 1 is that, vertically stacked, there is provided a loadlock arrangement LLA and a processing module arrangement PMA.

FIGS. 2 to 7 show in representations in analogy to that of FIG. 1, different preferred forms of realising the LLPT 1.

According to FIG. 2 the LLPT 1 comprises a number, for instance and as shown, three single substrate input/output loadlock stations $LL_{io}$ forming the LLA according to FIG. 1. The PMA in the embodiment of FIG. 2 consists of a further number, for instance again three single substrate processing chambers $PM_1$ to $PM_3$.

In the embodiment of the LLPT 1 of FIG. 3 the structure of LLA is the same as in the embodiment of FIG. 2. The PMA consists of a single substrate batch processing module PPM. In the embodiment of FIG. 4 the process module arrangement PMA is in fact equal to that as shown in FIG. 2. The loadlock arrangement LLA consists here of a first number of input single substrate loadlock modules $LL_i$ and of a second number as of output loadlock modules $LL_o$. In the embodiment of FIG. 5 the load lock arrangement LLA is conceived equally to the LLA of the embodiment of FIG. 4, whereas the processing module arrangement PMA consists of a batch processing module BPM as of the embodiment of FIG. 3.

The embodiment of the LLPT 1 as of FIG. 6 consists of a process module arrangement PMA realised e.g. as shown in one of the embodiments of FIGS. 2 to 5. The loadlock arrangement LLA consists of a substrate batch input/output load lock chamber $BLL_{io}$. According to the embodiment as schematized in FIG. 7 still with a process module arrangement PMA, e.g. as exemplified at the embodiments of FIGS. 2 to 5, the load lock arrangement LLA consists of a substrate batch input load lock module $BLL_i$ and of a substrate batch output load lock module $BLL_o$.

These examples of preferred embodiments do clearly teach the skilled artisan how to combine specifically tailored loadlock- and process modules to perform predetermined substrate processing, thereby maintaining the basic concept of the LLPT 1, namely of having a vertical tower with a loadlock arrangement and with a processing module arrangement.

Taking e.g. the embodiment of FIG. 2, in some instances it might be advantageous not to subdivide the vertical extent of the LLPT 1 into an upper loadlock- and a bottom process module arrangement, but to mix up modules of the LLA and modules of the PMA along the vertical extent of the loadlock- and processing tower LLPT 1. As was outlined in the introductory part of the present description, the present invention is especially directed on vacuum treating large two-dimensionally extended substrates, e.g. with sizes of at least 1 m$^2$, preferably of at least 2 m$^2$, and even of 4 m$^2$ and more.

Thereby, in a most preferred embodiment of the present invention overall processing, inclusive loadlocking, is performed with the substrates in horizontal position. This allows safe overall handling of the large surface and relatively thin substrates. In horizontal position they may be accurately held, during loadlocking transitions, during processing, and during transporting within the processing apparatus.

In FIG. 8 there is schematically shown a top view upon a LLPT 1 as of FIGS. 1 to 7 with a large surface substrate 3 positioned therein. Such positioning is preferably applied in the loadlock arrangement LLA as well as in the process module arrangement PMA. FIG. 9 schematically shows in a side view a part of a bottom wall 5, be it of a module of the load lock arrangement LLA, be it of a module of the processing module arrangement PMA. A large substrate 3 is deposited on a positioning arrangement which comprises, as schematically shown in FIG. 9, e.g. a member of distinct deposition pins 7 whereupon, the thin and large extent substrate 3 resides.

With respect to possible constructions of process modules of the process module arrangement PMA and/or of loadlock modules of the load lock arrangement LLA, specific attention is drawn to the U.S. Pat. No. 6,296,735 thereby specifically to its FIGS. 1, 2, 3, 5 to 11, 15 to 22, and the respective description, further to the U.S. Pat. No. 5,515,986 especially with respect to FIGS. 1, 2, 3, 5 to 9 further to the U.S. Pat. No. 6,177,129 thereby especially to FIGS. 1 to 4, 7 to 8 as concerns process module- and loadlock module conception, handling of the substrates as by the present transport arrangement $T_t$ and as will be described more in detail and as concerns overall timing and processing as will also be addressed more specifically later. Here also this document shall specifically be addressed with respective possible conception of process module and/or load lock module within the respective load lock arrangement and process module arrangement. Nevertheless, it must be pointed out that providing in one single tower as here described with respect to the FIGS. 1 to 9 load lock arrangement and processing module arrangement, it is not taught in the documents, just mentioned.

In the following description of the apparatus and method of manufacturing according to the present invention, we will refer to the previously described LLPT 1 per se, which means that any kind of its detailed structure, as was exemplified with respect to the FIGS. 1 to 9, may be applied. Only if specific measures should be or preferably are taken in consideration such LLPT in a specific embodiment to be described, then such embodiment of a LLPT will specifically be addressed.

In FIG. 10 there is shown schematically a side view of a first preferred embodiment of an apparatus according to the present invention for performing, according to the present invention, a method for manufacturing vacuum treated, substantially plane substrates. This first preferred embodiment essentially consists of one single LLPT 1. The LLPT 1 communicates by respective loadlock- and process module-openings, which are vertically aligned, with a transport arrangement TA 2 which latter performs handling of the substrates into and from the loadlock arrangement LLA as well as into and from the process module arrangement PMA. The transport arrangement 2 comprises a transport robot 9 which performs substrate transport according to h horizontally into and from respective modules of the loadlock arrangement LLA and of the process module arrangement PMA and further performs vertical transport v from a position aligned with at least one respective first opening towards alignment with at least one respective second opening of the PMA and LLA. FIG. 11 schematically shows the apparatus as of FIG. 10 in top view.

Thus, this first preferred embodiment of the apparatus according to the present invention comprises one transport arrangement TA 2 which serves one single LLPT 1 which latter comprises a loadlock arrangement LLA as well as process module arrangement PMA. Thereby, the loadlock arrangement LLA comprises input/output loadlocking ability as schematically shown in FIG. 10 by the double arrow i/o. In this embodiment the LLPT 1 defines for all loadlocking and processing which is necessary for a predetermined multi-processing step treatment of at least one substrate.

The transport arrangement TA 2 is provided to serve the substrate between respective openings at the LLPT 1. The transport arrangement TA 2 needs only perform by its robotic transporting member 9 horizontal—h—and vertical—v—transport movements. Whenever a different processing with different processing steps is to be performed on substrates, only the LLPT 1 must be exchanged. Due to the fact that all the modules or stations which are necessary for an intended substrate processing are stapled vertically one upon the other to result in the addressed LLPT 1, the footprint of all the modules necessary for such processing is reduced to a minimum. Additionally, the footprint of the transport arrangement is reduced to the minimum necessary to serve horizontally the respective modules of the LLA and PMA. In opposition to the teaching of the U.S. Pat. No. 5,275,709 the preferred apparatus as of FIGS. 10 and 11 in fact provides for a tower of modules which provide for all processing steps desired inclusive inputting and outputting the substrates to and from processing stations.

In FIGS. 12 and 13 there is shown, again schematically, the second preferred embodiment of an apparatus according to the present invention performing a manufacturing method according to the present invention. Thereby, a first LLPT 1a and a second LLPT 1b are both in communication with a common transport arrangement TA. The conceptions of the $LLA_a$ of the first LLPT 1a as well as of $PMA_a$ of that first LLPT 1a are selected to perform a first well-defined processing sequence with different processing steps upon substrates 3a.

At the second LLPT 1b the $LLA_b$ as well as the $PMA_b$ are conceived to perform a second process on a different set of substrate 3b. Thereby, the two process-sequences at the respective towers 1a and 1b may be equal, but may be alternatively different. In fact, each tower 1a and 1b per se provides for the complete ability to perform inputting/outputting of respective substrates to the respective vacuum treatment processes as well as the complete set of processing modules to perform the requested tower specific processing.

As shown in the FIGS. 12 and 13, the transport arrangement 2ab has the ability to perform horizontal and vertical substrate transport with respect to the first LLPT 1a and with respect to the second LLPT 1b completely independently. A robot 9ab is controlled to perform horizontal transportation $h_a$ with respect to tower 1a independently from such horizontal transportation $h_b$ with respect to the second tower 1b and in analogy to perform vertical $v_a$ transportation of substrates processed in tower 1a independently from such transport $v_b$ with respect to the second tower 1b.

In FIG. 14 there is schematically shown a robot 11 which may be applied within the vacuum chamber of the transport arrangement TA as of FIGS. 12 and 13.

According to FIG. 14 there is provided within the vacuum chamber of the transport arrangements (not shown) a stationary central support post 13. For handling large substantially flat and horizontally positioned substrates 3a with respect to the LLPT 1a of FIGS. 12 and 13, at the one side of post 13 there is provided a first sliding arrangement 14a which is vertically slideable—va—in controlled driven manner. Mounted to sliding arrangement 14a there is provided a number of single substrate supporting member 15a, as shown e.g. three. They project horizontally and are vertically mounted distant from each other and, in one preferred embodiment, with a controllably variable pitch distance $p_a$. Thus the pitch distance $p_a$ in this preferred embodiment may be controllably varied, e.g. to accommodate for substrate handling openings at the LLA and/or PMA with different vertical pitch distances.

Each of the supporting members 15a may be expanded and retracted horizontally—h—, driven by telescopic drives, as shown within encapsulations 17a, The supporting members 15a have supports with supporting pins 20 whereupon the substrates 3a to be processed in LLPT 1a are disposed during horizontal and vertical transport. There is further provided a second sliding arrangement 14b opposite sliding arrangement 14a along post 13, which is constructed with supporting members 15b, supports 19b supporting pins 20b, encapsulates 17b very much like the arrangement mounted on slide 14a whereby, as shown, the number of supporting members 15b which do handle substrates 3b with respect to LLPT 1b as of FIG. 12 or 13 needs not to be equal with the number of members 15a for serving substrate 3a to be processed by a LLPT 1a.

Preferably, the horizontally movable supports 19a and 19b are constructed in a forklike manner as shown in FIG. 15. In dashed line representation, FIG. 15 shows a respective substrate 3a,b residing on the support 19a,b and being thereby deposited on support pins 21 in a LLA or PMA. With the second preferred embodiment as of FIGS. 12 to 15 there is provided an apparatus according to the present invention with two distinct loadlock- and processing towers LLPT 1a and 1b which each provide for the complete set of modules to perform substrate processing inclusive feeding such substrate from surrounding atmosphere AT to the vacuum processing and from vacuum processing back to surrounding atmosphere.

According to this second preferred embodiment too, the robot 9ab within the transport arrangements TA 2ab needs not perform any rotational movement. Substrate transport is realised merely by horizontal—h— and vertical—v—substrate movement.

As schematically shown in FIG. 14, a controlling unit 22 is provided for controlling the horizontal transport movements $h_{a,b}$, the vertical transport movements $v_{a,b}$ with respect to their extent, timing of respective horizontal and vertical transport cycles as well as, if necessary, pitch distance $p_a$ of the respective support arrangements. Such a control unit 22 is preferably realised as a free programmable unit so that in dependency of an intended processing especially timing of the transport cycles may flexibly be adapted. Such a controlling unit 22 preferably also controls processing and loadlock cycles as schematically shown in FIG. 14 with the control connections to $LLA_{ab}$ and $PMA_{ab}$.

Taking into account that in most multiple step processing treatments of substrates the time amount necessitated to perform a respective vacuum treatment within a process module of PMA and the time amount for feeding substrate through the loadlock arrangement LLA will be larger than the time amount for transporting a substrate or a batch of substrates from one module to another, in further preferred embodiment, the transport robot within transport arrangement TA 9ab in fact provides only for one single up/down moving facility.

According to FIG. 16 such robot comprises a drawerlike member 25 which is controllably drivable in vertical direction v up and down guide 27.

Within drawerlike member 25, again controllably drivable and moveable in horizontal direction h there is provided a slide 29 which has a frame or forklike shape and which may be horizontal driven into a respective module of the loadlock- or process module arrangement.

As shown in dashed lines in FIG. 16, this embodiment of a transport robot provides the possibility to propel the slide 29 to the left or to the right hand side of the guide members 27.

This may be applied to the embodiment of FIGS. 12 and 13 for transporting a substrate from a module of LLPT 1a to a module of the LLPT 1b and vice versa. Thereby, e.g. in LLPT 1a, the loadlock arrangement $LLA_a$ may be exclusively conceived as an input loadlock module and the $LLA_b$ in LLPT 1b exclusively as an output loadlock module. Further, there may be provided a processing module which is used for substrates treated in the LLPT 1a and treated in the LLPT 1b. Thus a crosswise transport of substrates between LLPT 1a and LLPT 1b, as well as provision of a common treatment module for both LLPT 1a and 1b is not excluded. By the embodiment of FIG. 16 handling of substrates between LLPT 1a and LLPT 1b and serving a common treatment module without rotation of the substrates around the vertical axis in the transport arrangement.

Nevertheless, such rotation free crosswise handling may also be realised by a robot different than shown in FIG. 16.

The apparatus according to the present invention in its most preferred embodiments as of FIGS. 10 and 12 does not necessitate any rotational movement about the vertical axis of a robot handling the substrates. The embodiment as of FIG. 12 may be called I-type due to its I-shaped footprint.

In the FIGS. 17, 18, and 19 further preferred embodiments of the apparatus according to the present invention are schematically shown representations in analogy to that of FIG. 13. These embodiments do also not necessitate any rotational movement of a robot within the transport arrangement TA, about a vertical axis, so as to serve the openings of the LLPT's.

According to FIG. 17 to 19, instead of construing the apparatus in an I-type configuration as of FIGS. 12 and 13 it is designed as a U-type apparatus. According to FIG. 17, the two LLPT's 1a and 1b are provided in a side by side position. In the vacuum chamber of the transport arrangement TA two robots 9a and 9b are installed, each serving the modules of one of the LLPT 1a,1b via the respective openings. Each of the robots 9a,9b provides for a vertical up and down movement $v_a,v_b$ in a controllably driven manner. Each of the robots 9a,9b further provides for horizontal forth and back movement $h_a$ and $h_b$ towards and into or from the modules of the respective LLPT 1a,1b.

The robots 9a and 9b may e.g. be principally conceived according to the robot shown in FIG. 14 with support members $15_a$ and $15_b$ not pointing from each other but being provided on one side of support 13 and in parallelism. The movements of the two robots 9a and 9b may be independently controlled preferably by means of a freely reprogrammable control unit (not shown). If a time-synchronous processing shall be established at the two LLPT 1a,1b, either the two independently controllable robots 9a and 9b are synchronously operated, or there is provided a single robot which serves simultaneously both LLPT 1a,1b.

Such an embodiment is shown in FIG. 18 again schematically and in a representation in analogy to that of FIG. 17. As clearly be seen, there is provided one single robot 9ab which provides combined common vertical transport movement $v_{ab}$ of substrates into alignment with openings at the LLPT 1a and 1b. The horizontal movements $h_a,h_b$ are either synchronised, or are controlled specifically for each LLPTM.

A third embodiment of U-shaped concept is shown in FIG. 19. Here again only one single robot 9ab is provided. The one robot 9ab serves by vertical transport movement $v_{ab}$ and horizontal transport movement $h_{ab}$ both LLPT's 1a and 1b. To do so the robot 9ab performs a horizontal movement $w_{ab}$ as shown.

From the concepts as shown schematically in the FIGS. 17 to 19 a variant is shown in FIG. 20, as an Y-type concept. Here the two LLPT's 1a and 1b are arranged at the transport arrangement TA so as to define an angle φ. In FIG. 20 the robot concept is principally the same as shown in FIG. 18. The single robot 9ab serves the modules of both angularly displaced LLPT 1a and 1b. Thereby, such robot may be realised very similar to that shown in FIG. 14, thereby providing the supporting members not opposite each others but at the desired angle φ about the central axis of post 13.

For such an Y-type embodiment of the apparatus a further mode of realising the robot within transport arrangement TA, principally according to FIG. 19, is shown in FIG. 21. The robot 9ab is conceived to rotate about the central axis by at least the angle of φ so as to serve the modules of both angularly displaced LLPT's 1a,1b.

As was mentioned above, providing two or more LLPT's allows flexible full parallel processing of different or equal multi-step processes. Following up this concept it is absolutely possible as shown in FIG. 22 to conceive the transport arrangement with a transport robot $9_{rot}$ which is rotatable about a central axis so as to serve more than two as shown e.g. for LLPT's mounted circularly around the transport arrangement TA. Nevertheless, more preferred embodiments of the apparatus according to the present invention are the single LLPT structure as of FIG. 10, two LLPT-structures of I- or U- or possibly Y-type as of FIGS. 17 to 21.

In FIG. 23 there is shown a today's preferred apparatus according to the present invention. It is conceived according to the concept of FIG. 10. Such preferred embodiment comprises one single LLPT which consists, from top to bottom, of a two-substrate batch processing module $BPM_1$ followed by a two-substrate batch input and output load lock module $BLL_{io}$, followed by a second two-substrate batch processing module $BPM_2$. Thereby, the loadlock module $BLL_{io}$ is subdivided into a first input loadlock compartment $C_i$, followed by a first output loadlock compartment $C_o$, followed by a second input loadlock compartment $C_i$ and finally a second output loadlock compartment $C_o$. The respective openings 33 which establish communication between $BPM_1$, $BL_{io}$, $BPM_2$ and a transport arrangement TA, are provided with respectively controlled valves 35.

Within the transport arrangement TA-chamber 37 there is provided a robot 39 which is drivingly moveable in a controlled manner in horizontal direction h and comprises a two-substrate batch transport member 41 with an upper and with a lower substrate transport fork $43_U$ and $43_l$. The overall arrangement of the two horizontal transport members 41 is drivingly moveable vertically in a controlled manner. The pitch between the upper substrate carrier fork $43_u$ and a lower substrate carrier fork $43_l$ is selected to be in agreement with the pitch between the openings at each of the batch processing modules and the batch loadlock module.

Such an apparatus is most suited to be used for processing large substrates of at least 1 m², preferably of at least 2 m², even of at least 4 m² as for solar panel, TFT or plasma display panel manufacturing. As the process modules of the present invention may be separated from the transport chamber by valves, they can operate independently from each other if required.

With respect to further details we refer to:
U.S. Pat. No. 6,177,129 with respect to overall timing and cycle control preferably in a reprogrammable technique as well as with respect to possible implementation of flexible robot technique cooperating with process- or loadlock modules.
U.S. Pat. No. 6,533,534;
U.S. Pat. No. 5,515,986 and
U.S. Pat. No. 6,296,375 with respect to techniques of conceiving process module, loadlock module and their serving by robot members for treating horizontally oriented flat substrates.

The documents shall form an integrated part of the present Description.

The invention claimed is:

1. A method for manufacturing two-dimensionally extended vacuum treated substrates comprising the steps of:
introducing a first horizontal substrate horizontally into a first loadlock chamber that is provided in a first loadlock and processing tower;
introducing a second horizontal substrate horizontally into a second loadlock chamber that is provided in a second loadlock and processing tower;
transporting each said first and second horizontal substrate horizontally from said first and second loadlock chambers, respectively, into a common vacuum transport chamber;
controllably moving each said first and second horizontal substrate, respectively, vertically until each is aligned with a respective first processing chamber and second processing chamber provided, respectively, in said first loadlock and processing tower and said second loadlock and processing tower;
horizontally introducing said first and second horizontal substrates into said first and second processing chambers, respectively;
treating said first and second horizontal substrates in said first processing chamber and said second processing chamber, respectively;
horizontally removing each of the first and second treated horizontal substrates, respectively, from the respective first and second processing chamber, back into said common vacuum transport chamber;
vertically transporting each said first and second treated horizontal substrate within said common vacuum transport chamber until said first treated substrate is aligned with said first or a further loadlock chamber located in said first tower, and said second treated substrate is aligned with said second or a further loadlock chamber located in said second tower;
horizontally transporting said first and second treated horizontal substrates from said common vacuum transport chamber into the respectively aligned loadlock chambers located in said first and second towers, respectively;
removing each said first and second treated horizontal substrate horizontally from the respective loadlock chamber into the ambient environment;
wherein analogous operations with respect to each of the first and second horizontal substrates are not necessarily carried out at the same time.

2. The method of claim 1, wherein each of said first and second horizontal substrates is moved exclusively linearly in all of the recited steps.

3. The method of claim 1, wherein different treatment processes are carried out on each of the first and second horizontal substrates in the respective first and second loadlock and processing towers.

4. The method of claim 3, wherein both the first and second loadlock and processing towers, where different treatment processes are being carried out, are served by a common robot for transporting the respective first and second horizontal substrates among different chambers in each of the first and second towers, respectively.

5. The method of claim 4, wherein said transport robot comprises at least one horizontal substrate support for at least one substrate which support is driven exclusively in vertical and in horizontal direction, in a respectively controlled manner.

6. The method of claim 1, wherein said first and said second loadlock and processing towers are arranged on opposite sides of said common vacuum chamber and facing each other.

7. The method of claim 1, wherein said first and said second loadlock and processing towers are arranged one next to the other on one side of said common transport chamber, said towers and said vacuum transport chamber thereby defining a U-shaped footprint.

8. The method of claim 1, wherein said first and said second loadlock and processing towers are arranged with respect to said common vacuum transport chamber to define a Y-shaped footprint.

9. The method of claim 1, wherein said first and second horizontal substrates each have an extent of at least 1 m₂.

* * * * *

UNITED STATES PATENT AND TRADEMARK OFFICE
CERTIFICATE OF CORRECTION

PATENT NO.         : 7,244,086 B2                                   Page 1 of 1
APPLICATION NO. : 10/713339
DATED              : July 17, 2007
INVENTOR(S)        : Herbert Bãchier et al.

It is certified that error appears in the above-identified patent and that said Letters Patent is hereby corrected as shown below:

On the cover page, insert item [30]:

--Related U.S. Application Data--

--This application claims priority of U.S. Provisional Application Serial No.: 60/426,697--

Column 5, line 17:   Please delete "1A" and insert therefor --1 A--.

Column 11, line 59:  Please delete "9a,9b" and insert therefor --9a, 9b--.

Column 11, line 61:  Please delete "9a,9b" and insert therefor --9a, 9b--.

Column 11, line 63:  Please delete "1a,1b" and insert therefor --1a, 1b--.

Column 12, line 62:  Please delete "$BL_{io}$ and insert therefore --$BLL_{io}$--.

Column 14, line 53:  Please delete "1 $m_2$" and insert therefore --1 $m^2$--.

Signed and Sealed this

Eighth Day of April, 2008

JON W. DUDAS
*Director of the United States Patent and Trademark Office*